United States Patent
Chang et al.

(10) Patent No.: US 12,103,239 B2
(45) Date of Patent: Oct. 1, 2024

(54) METHOD AND SYSTEM FOR MANUFACTURING HIGH-RESOLUTION STRUCTURE USING SIZE-TUNABLE HYDROGEL

(71) Applicant: Korea Advanced Institute of Science and Technology, Daejeon (KR)

(72) Inventors: JaeByum Chang, Daejeon (KR); Eunseok Heo, Daejeon (KR); In Cho, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 18 days.

(21) Appl. No.: 17/508,741

(22) Filed: Oct. 22, 2021

(65) Prior Publication Data

US 2022/0126523 A1  Apr. 28, 2022

(30) Foreign Application Priority Data

Oct. 27, 2020  (KR) .......................... 10-2020-0139929
Sep. 16, 2021  (KR) .......................... 10-2021-0123888

(51) Int. Cl.
*B29C 64/40* (2017.01)
*B29C 64/106* (2017.01)
*B29C 64/245* (2017.01)
*B29C 64/30* (2017.01)
*B33Y 10/00* (2015.01)
*B33Y 70/00* (2020.01)
(Continued)

(52) U.S. Cl.
CPC ............ *B29C 64/40* (2017.08); *B29C 64/106* (2017.08); *B29C 64/245* (2017.08); *B29C 64/30* (2017.08); *B33Y 10/00* (2014.12); *B33Y 30/00* (2014.12); *B33Y 40/10* (2020.01); *B33Y 70/00* (2014.12)

(58) Field of Classification Search
CPC ..... B29C 64/40; B29C 64/106; B29C 64/245; B29C 64/30; B33Y 10/00; B33Y 30/00; B33Y 40/10; B33Y 70/00; B33Y 80/00
See application file for complete search history.

(56) References Cited

U.S. PATENT DOCUMENTS

2016/0287756 A1*  10/2016  Lewis ................... B33Y 10/00
2017/0081489 A1*   3/2017  Rodriques ............. C08J 3/28
2017/0217091 A1*   8/2017  Hull ..................... B29C 64/40
(Continued)

OTHER PUBLICATIONS

Das et al. "Generation of Sub-micrometer-scale Patterns by Successive Miniaturization Using Hydrogels," 2007, Advanced Materials, 19, 1943-1946 (Year: 2007).*

(Continued)

*Primary Examiner* — Galen H Hauth
*Assistant Examiner* — Baileigh Kate Darnell
(74) *Attorney, Agent, or Firm* — BKRIP LLC

(57) ABSTRACT

Various embodiments provide a method of manufacturing a high-resolution structure using a size-tunable hydrogel. According to various embodiments, a basic structure may be fabricated. A temporary structure made of a hydrogel may be fabricated by applying a hydrogel to the basic structure. The temporary structure may shrink by dehydrating the hydrogel. This process may be repeated to fabricate smaller structures. The final structure may be fabricated using the temporary structure or the basic structure.

13 Claims, 11 Drawing Sheets

(51) Int. Cl.
     *B33Y 30/00*      (2015.01)
     *B33Y 40/10*      (2020.01)

(56) References Cited

U.S. PATENT DOCUMENTS

| | | | |
|---|---|---|---|
| 2018/0110901 A1* | 4/2018 | Lewis | A61L 27/50 |
| 2018/0280578 A1* | 10/2018 | Hwang | A61L 27/222 |
| 2020/0022256 A1* | 1/2020 | Sun | H05K 1/0393 |
| 2023/0203448 A1* | 6/2023 | Iuliano | G01N 33/5088 |
| | | | 435/366 |

OTHER PUBLICATIONS

Kang et al. "Facile microfabrication of 3-dimensional (3D) hydrophobic polymer surfaces using 3D printing technology," 2020, Applied Surface Science, vol. 499, 143733 (Year: 2020).*

* cited by examiner

FIG. 9
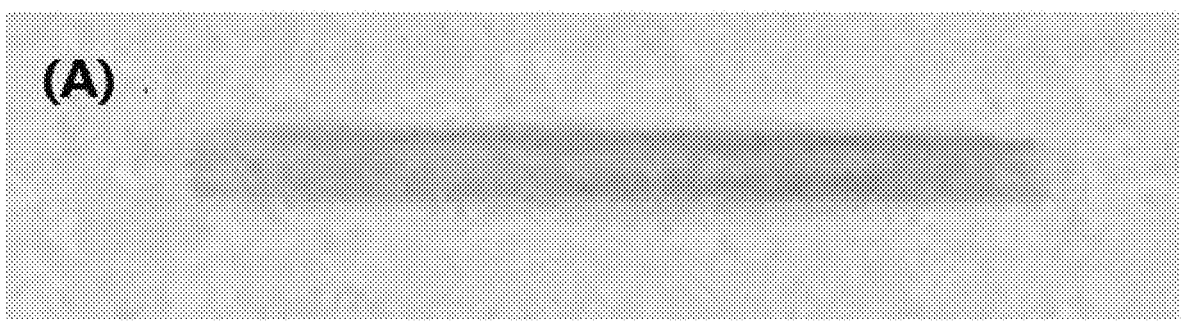
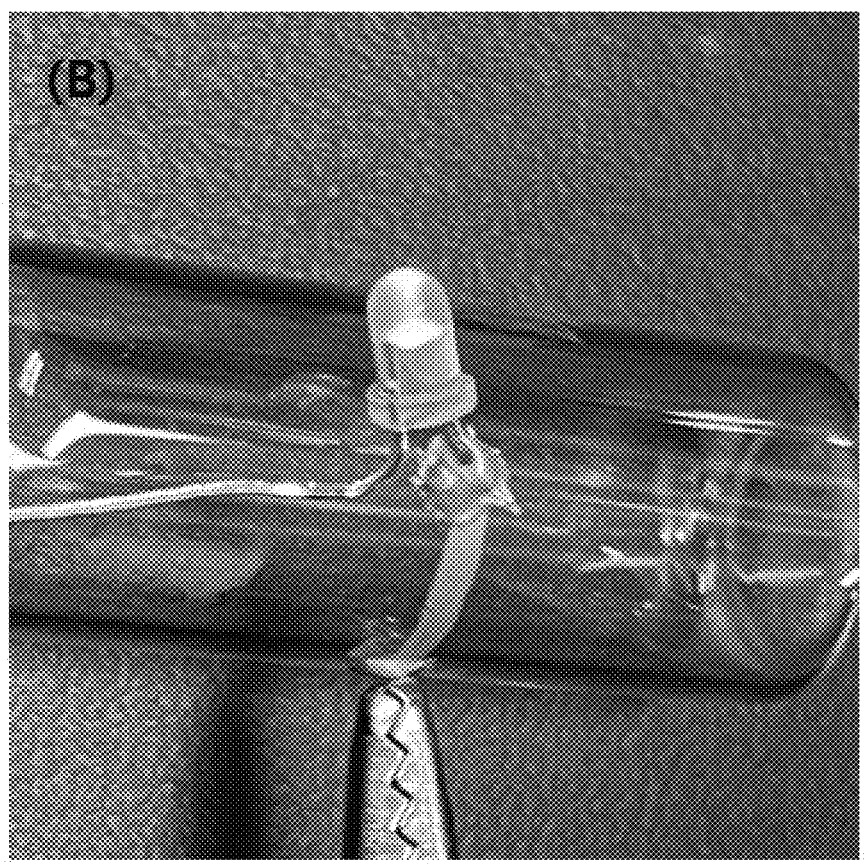

METHOD AND SYSTEM FOR MANUFACTURING HIGH-RESOLUTION STRUCTURE USING SIZE-TUNABLE HYDROGEL

CROSS-REFERENCES TO RELATED APPLICATIONS

This application is based on and claims priority under 35 U.S.C. 119 to Korean Patent Application Nos. 10-2020-0139929 filed on Oct. 27, 2020, and 10-2021-0123888 filed on Sep. 16, 2021 in the Korean intellectual property office, the disclosures of each of which are herein incorporated by reference in their entireties.

TECHNICAL FIELD

Various embodiments relate to a method and system for manufacturing a high-resolution structure using size-tunable hydrogels.

BACKGROUND OF THE INVENTION

A three-dimensional (3-D) printing technology is an additive manufacturing (AM) construction method of fabricating a structure by stacking a designed model layer by layer in a 3-D way by using a Computer-Aided Design (CAD) program.

The stereolithography (SLA) process was first developed in 1984, the technique for fabricating the 3-D structure by curing a resin layer by layer using laser or ultraviolet exposure. After that, various 3-D printing techniques, including the Fused Deposition Modeling (FDM) methods, were introduced. The widely-used and straightforward 3-D printing techniques, FDM methods, fabricates 3-D structures by extruding a thermoplastic material through a hot nozzle and stacking it layer by layer. Such 3-D printing methods are highly beneficial because they can produce various and complicated structures that are difficult to implement on the two-dimensional (2-D) plane. Also, multiple materials, such as polymers, metals, and ceramics, can be used via 3-D printing technology.

Charles Hull first introduced a 3-D printing system in the USA in 1984. After registering the patent related to the SLA process, the 3-D printing technology started to be commercialized in earnest. As the original patent for 3-D printing technology expired, 3-D printer-related costs decreased, and the patent accessibility increased, which drew more attention. The 3-D printing technology tends to be used in various industry fields beyond fabricating simple molds or Rapid Prototyping (RP). With the diversity of materials and improvements in technical skills, 3-D printing technology has been expanded to new fields. The introduction of 3-D printing technology in various industries is actively progressing for reasons such as minimization of material loss, personalized production, ease of design, and high precision. In addition to the manufacturing and construction industry applications, this technology is also in the spotlight even in biomedical fields, which requires a unique form suitable for individual patients.

As described above, 3-D printing has been in the spotlight as the future promising technology having a possibility that 3-D printing can be used in various fields, and usability has also increased significantly. The resolution of a stacked part using 3-D printing depends on the types of printing methods used and the performance of a 3-D printer. For the 3-D printing technique to be used in more diverse fields, it is essential how precisely the designed model drawings can be expressed and produced.

As 3-D printing-related costs are decreased compared to conventional technologies, the scope of application of 3-D printing is gradually expanding to homes, schools, and research laboratories in addition to industrial fields where the 3-D printing methods are mainly used. For personalized production that can be used in daily life based on increased accessibility, resolution of the 3-D printing high enough to replace existing products is emerging as an essential element.

Several 3-D printing methods have different resolutions ranging from tens of microns to several hundreds of microns. The SLA method having a resolution of tens of microns shows the high resolution. In contrast, the FDM method, the technique most used for a personal 3-D printer, tends to have a relatively lower resolution of several hundreds of microns. In general, as the 3-D printing technique has a high resolution, it has several limitations, including the cost aspect. For example, in the case of the SLA technique having a high resolution of several tens of microns, the cost of equipment and materials used are high, and the printing speed is slow. On the other hand, the commonly used FDM technique has a relatively low cost and a fast printing speed but relatively low resolution. Other 3-D printing techniques like the SLS (Selective Laser Sintering) and the IP (Inkjet Printing) have similar trends.

SUMMARY

This summary is provided to introduce a selection of concepts in a simplified form that is further described below in the Detailed Description. This summary is not intended to identify key features of the claimed subject matter, nor is it intended to be used as an aid in determining the scope of the claimed subject matter.

Various embodiments are intended to overcome limits related to resolution and costs, which are common challenges to different manufacturing methods, including the 3-D printing method. They propose a high-resolution structure manufacturing technology using size-tunable hydrogels.

In various embodiments, a method of manufacturing a high-resolution structure may include fabricating a basic structure, fabricating a temporary structure made of a hydrogel by surrounding the basic structure with a hydrogel, shrinking the temporary structure by shrinking the hydrogel and fabricating the final structure by using the temporary structure or the basic structure.

In various embodiments, a system for manufacturing a high-resolution structure may include a basic structure fabrication unit configured to fabricate the basic structure, a temporary structure fabrication unit configured to fabricate the temporary structure made of a hydrogel by surrounding the basic structure with a hydrogel, a temporary structure shrinkage unit configured to shrink the temporary structure by shrinking the hydrogel, and a final structure fabrication unit configured to fabricate the final structure by using the temporary structure or the basic structure.

According to various embodiments, a high-resolution structure can be manufactured using size-tunable hydrogels. Specifically, by repeatedly shrinking the hydrogel while replacing the basic structure produced through 3-D printing with the hydrogel, the final structure with a higher resolution, that is, a reduced size, can be obtained. As such, various embodiments are compatible with the existing 3-D printing techniques and can be implemented without additional equipment through hydrogels that can be synthesized at a low cost, which is advantageous in cost and time. Furthermore, according to various embodiments, the final structure can be manufactured using several materials, such as elastomers, resins, plastics, and hydrogels. Accordingly, various embodiments may be utilized to easily manufacture a product suitable for individual needs or to easily manufacture a high-precision and miniaturized device having multiple functions, such as a lab-on-a-chip and a sensor.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIGS. 5 to 11 are diagrams for describing applications of various embodiments.

DETAILED DESCRIPTION

Figure 1:
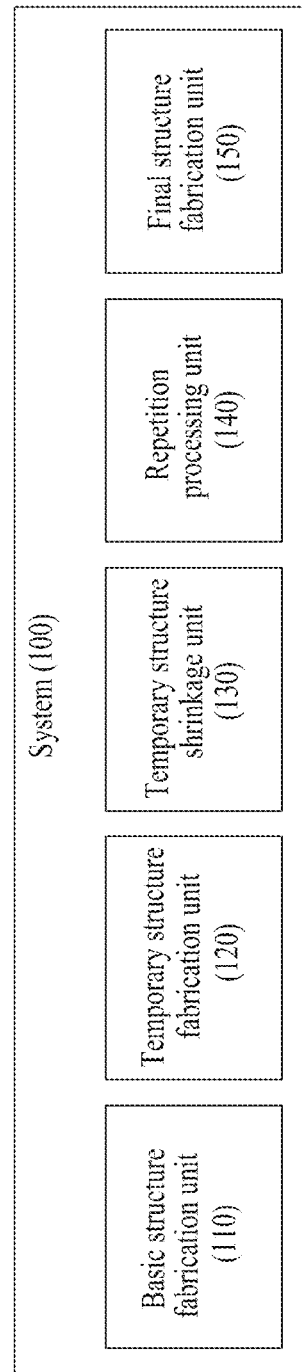
FIG. 1 is a diagram illustrating a system for manufacturing a high-resolution structure according to various embodiments.

While illustrative embodiments have been illustrated and described, it will be appreciated that various changes can be made therein without departing from the spirit and scope of the invention.

Hereinafter, various embodiments are described with reference to the accompanying drawings.

Various embodiments propose a high-resolution structure manufacturing technology using size-tunable hydrogels. Various embodiments have the following three characteristics. The first characteristic is that a high-resolution structure having a resolution higher than the resolution of a corresponding 3-D printer can be manufactured using various 3-D printers. The second is that the present technology can be implemented with hydrogels that can be synthesized at a low cost without additional equipment. The last is that the final structure can be made using multiple materials, such as plastics, polydimethylsiloxane (PDMS), and hydrogels.

Various embodiments show a difference from the existing technologies, as they improve the resolution by introducing a new material rather than enhancing the performance of the 3-D printer itself.

In general, the resolution of a structure manufactured using a 3-D printer is determined by the 3-D printing method used and the performance of the equipment. To obtain a high-resolution structure, a corresponding expensive and high-performance 3-D printer is necessary. Furthermore, high costs and relatively long time are required to develop new equipment having a resolution higher the existing resolution limit. Various embodiments propose a technology that can overcome the cost and time limitations by introducing a material called a shrinkable hydrogel in the intermediate process.

Various embodiments have the feature of being compatible with several 3-D printers that can be used independently and have advantages in terms of cost in that they use a hydrogel that can be synthesized at low cost without additional equipment. Various embodiments can be applied to commonly available low-resolution 3-D printers to overcome the resolution limit. A structure with a resolution several times higher than the initial output can be manufactured by repeatedly performing the entire process.

Various embodiments are different from the existing 3-D printing technologies in that they can manufacture a structure using multiple materials such as an elastomer, resin, plastic, hydrogel, etc., in addition to the existing limited printing materials. In general, 3-D printing manufacturing techniques have compatible materials for each method. In the case of the FDM technique, only a thermoplastic material can be used because the structure is produced through nozzle injection after melting the printing material at a high temperature. In the SLA technique, a photocurable resin must be used because the structure is cured layer by layer through light. Various embodiments are a technology that can be used more widely than existing 3-D printing techniques because the final structure can be manufactured from multiple materials that can be cured, such as elastomers, resins, plastics, and hydrogels.

Figure 2:
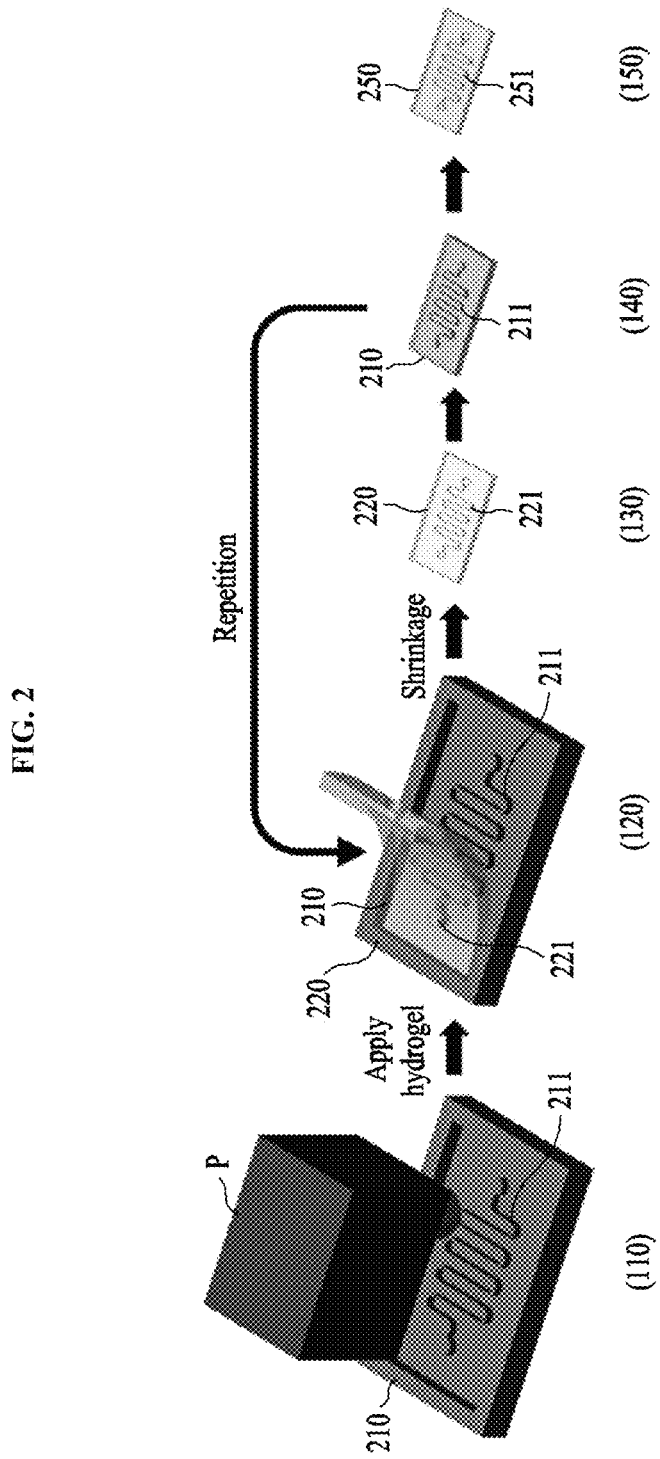
FIG. 2 is a diagram for describing a scenario for manufacturing a high-resolution structure according to a first embodiment.
Figure 3:
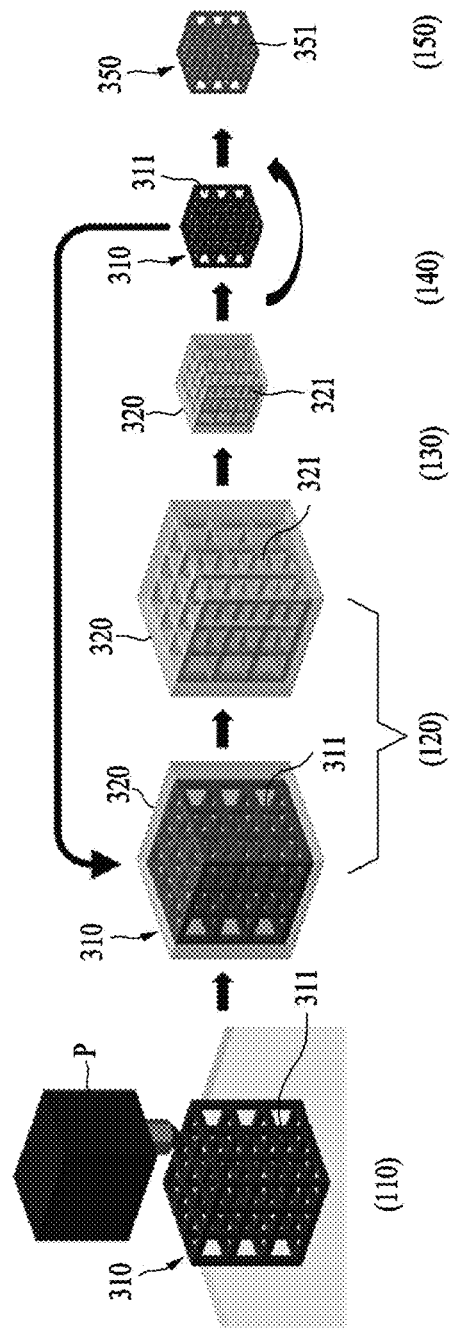
FIG. 3 is a diagram for describing a scenario for manufacturing a high-resolution structure according to a second embodiment.

FIG. 1 is a diagram illustrating a system (100) for manufacturing a high-resolution structure according to various embodiments. FIG. 2 is a diagram describing a scenario for manufacturing a high-resolution structure according to a first embodiment. FIG. 3 is a diagram describing a scenario for manufacturing a high-resolution structure according to a second embodiment.

Referring to FIG. 1, the system (100) may use a shrinkable hydrogel to manufacture the final high-resolution structure (250, 350) from the basic structure (210, 310). The system (100) repeatedly reduces the basic structure (210, 310) by using the hydrogel, and through this, the final structure (250, 350) with a higher resolution can be manufactured. Specifically, the system (100) may include a basic structure fabrication unit (110), a temporary structure fabrication unit (120), a temporary structure shrinkage unit (130), a repetition processing unit (140), or a final structure fabrication unit (150). In some embodiments, at least one of the components of the system (100) may be omitted, and at least one other component may be added. In some embodiments, at least any two of the components of system (100) may be integrated into one.

The basic structure fabrication unit (110) may be fabricated from the basic structure (210). In this case, in the basic structure fabrication unit (110), the basic structure (210, 310) may be fabricated using the basic material. Furthermore, the basic structure fabrication unit (110) may fabricate the basic structure (210, 310) by using a technology capable of producing arbitrary 2-D and 3-D structures, such as patterning, printing, and molding technologies, including 3-D printing. To this end, the basic structure fabrication unit (110) may include a 3-D printer (P).

In the temporary structure fabrication unit (120), the temporary structure (220, 320) may be fabricated by applying a hydrogel to the basic structure (210, 310). Accordingly, the temporary structure (220, 320) may be made of hydrogels. In this case, the hydrogel may have a characteristic in which the hydrogel may be contracted. Furthermore, the hydrogel may fill the space in a liquid state having flowability, and then become gelled to form temporary structure (220, 320) having a shape. The temporary structure (220, 320) may maintain the shape. For example, hydrogel (220, 320) may be a stretchable hydrogel. Accordingly, the temporary structure (220, 320) may have stretchability and flexibility. Furthermore, the temporary structure (220, 320) may provide a channel corresponding to the basic structure (210, 310).

According to the first embodiment, in the basic structure fabrication unit (110), as illustrated in FIG. 2, the basic structure (210) may have a predetermined pattern (211). For example, the pattern (211) may be provided on one surface of the basic structure (210). In such a case, in the temporary structure fabrication unit (120), as illustrated in FIG. 2, the temporary structure (220) may be fabricated by applying a hydrogel on the pattern (211) of the basic structure (210). Furthermore, the temporary structure (220) may be obtained by separating the temporary structure (220) from the pattern (211). At this time, as the temporary structure (220) has stretchability and flexibility, damage to the temporary structure (220) may be prevented when the temporary structure (220) is separated from the pattern (211). Accordingly, a recess (221) corresponding to the pattern (211) of the basic structure (210) may be provided on one surface of the temporary structure (220) as a channel.

According to the second embodiment, in the basic structure fabrication unit (110), as illustrated in FIG. 3, the basic structure (310) may be obtained according to a predetermined pattern (311). In such a case, in the temporary structure fabrication unit (120), as illustrated in FIG. 3, the temporary structure (320) may be fabricated by applying a hydrogel to surround the basic structure (310). In this case, the hydrogel may be removed by using physical force or through chemical treatment. For example, hydrogel dissolved under a specific chemical condition (e.g., pH, temperature, ion concentration, catalytic treatment, or a chemical reaction) may be used. Alternatively, the hydrogel can be physically removed after using a hydrogel that can expand or deform easily under these chemical conditions.

And, by removing the basic structure (310) from the temporary structure (320), the temporary structure (320) can be obtained. In this case, the basic structure (310) may be removed using physical force or chemical treatment. To this end, the basic material of the basic structure (310) may be a material that may be dissolved under a specific condition, such as Poly Lactic Acid (PLA) or Acrylonitrile Butadiene Styrene (ABS). For example, the basic structure (310) may be removed without affecting the shape or size of the temporary structure (320) by dissolving the basic material using an organic solvent such as chloroform or dichloromethane. Alternatively, after being softened through the treatment of the organic solvent, the basic structure (310) may be physically removed. Otherwise, after being dissolved or softened under a specific chemical condition (e.g., pH, temperature, ion concentration, catalytic treatment, or a chemical reaction), the basic structure (310) may be physically removed. Accordingly, a cavity (321) corresponding to a pattern (311) of the basic structure (310) may be obtained as a channel within the temporary structure (320).

In the temporary structure shrinkage unit (130), the temporary structure (220, 320) may be shrunk. In this case, in the temporary structure shrinkage unit (130), the temporary structure (220, 320) may shrink by dehydrating the hydrogel. When the hydrogel is dried, moisture in the hydrogel is evaporated, and thus, the temporary structure (220, 320) may shrink. As the temporary structure (220, 320) shrinks, the channel and cavity of the temporary structure (220, 320) may also shrink. For example, for isotropic shrinkage, the hydrogel may be slowly dehydrated while gradually raising a temperature in a humid environment. Through this, the temporary structure (220, 320) may shrink in the longitudinal direction by about 40% to about 50% compared to before the shrinkage. Alternatively, hydrogel, which shrinks under a specific chemical condition, may be used. For example, hydrogel, which shrinks at a high temperature or a low temperature, in high pH or low pH, at a high ion concentration or low ion concentration, after a chemical reaction may be used.

If necessary, in the repetition processing unit (140), the basic structure (210, 310) may be fabricated again using the temporary structure (220, 320). Accordingly, in the repetition processing unit (140), the basic structure (210, 310) having a reduced size may be fabricated. For example, in the first repetition, the basic structure (210, 310) has a size reduced to ½ compared to the initially manufactured basic structure (210, 310) may be fabricated. Furthermore, the basic structure (210, 310) fabricated in the repetition processing unit (140) may be provided to the temporary structure fabrication unit (120). Accordingly, through repetition in the temporary structure fabrication unit (120) and the temporary structure shrinkage unit (130), the temporary structure (220, 320) having a further reduced size may be obtained. That is, the temporary structure (220, 320) of repeatedly reduced size may be fabricated and shrunk. For example, as the number of repetitions increases by two, three, etc., the basic structure (210, 310) having a size reduced by ¼, ⅛, etc., compared to the size of the initial basic structure (210, 310), will be fabricated.

According to the first embodiment, in the repetition processing unit (140), as illustrated in FIG. 2, the basic structure (210) may be fabricated by applying the basic material to the surface of the temporary structure (220). In this case, the basic material may be curable. For example, the basic material may be cured after being applied to the surface of the temporary structure (220) and may form the basic structure (210). Furthermore, the basic structure (210) may be obtained by separating the temporary structure (220) from the basic structure (210). In this case, in the temporary structure shrinkage unit (130), as the temporary structure (220) shrinks, the recess (221) of the temporary structure (220) also shrinks. In the repetition processing unit (140), the basic structure (210) may have the pattern (211) corresponding to the recess (221) of the temporary structure (220). Furthermore, the basic structure (210) fabricated in the repetition processing unit (140) may be provided to the temporary structure fabrication unit (120).

According to the second embodiment, in the repetition processing unit (140), as illustrated in FIG. 3, the basic structure (310) may be fabricated by filling the inside of the temporary structure (320) with basic material. In this case, the basic material may have any shape and may be curable. For example, the basic material may be cured after being applied to the inside of the temporary structure (320) and may form the basic structure (310). Furthermore, the basic structure (310) may be obtained by removing the temporary structure (320) from the basic structure (310). For example, the cured basic material is cut into small pieces to form a powder, put into the cavity (321) inside the temporary structure (320). The temperature is raised to soften or dissolve the basic material to uniformly fill the cavity (321). Then, the temperature can be lowered to harden the basic material. For another example, after the cured basic material is dissolved in a solvent and put into the cavity (321), the cured basic structure (310) may be formed by evaporating the solvent.

At this time, the temporary structure (320) may be removed by dissolving the temporary structure (320). For example, the hydrogel may be removed using physical force or through dissolution under a specific chemical condition (e.g., pH, temperature, ion concentration, catalytic treatment, or a chemical reaction). In addition, after using hydrogel that can be expanded or easily deformed under such chemical conditions, the temporary structure (320) may be removed without affecting the shape or size of the basic structure (310) by physically removing the hydrogel. In this case, in the temporary structure shrinkage unit (130), as the temporary structure (320) shrinks, the cavity (321) of the temporary structure (320) may also shrink. In the repetition processing unit (140), the basic structure (310) may have the pattern (311) corresponding to the cavity (321) of the temporary structure (320). Furthermore, the basic structure (310) fabricated in the repetition processing unit (140) may be provided to the temporary structure fabrication unit (120).

In the final structure fabrication unit (150), the final structure (250, 350) may be fabricated using the temporary structure (220, 320) or the basic structure (210, 310). In this case, in the final structure fabrication unit (150), the final material (250, 350) may be fabricated using the final material. For example, the final material may include at least one of elastomer, resin, plastic, metal, metal oxide, ceramic, polymers, or hydrogels. Accordingly, in the final structure fabrication unit (150), the final structure (250, 350) having a reduced size may be fabricated. For example, if not repeated by the repetition processing unit (140), the final structure (250, 350) having a size reduced by ½ compared to the size of the initial basic structure (210, 310) may be fabricated. For another example, as two or three repetition numbers are added by the repetition processing unit (140), the final structure (250, 350) having a size reduced by ¼ or ⅛, compared to the size of the initial basic structure (210, 310) may be fabricated. Here, the final structure (250, 350) may be formed from the temporary structure (220, 320). In this case, the final structure (250, 350) has a reverse tone of the initial basic structure (210, 310). The final structure (250, 350) may be formed from the basic structure (210, 310). In such a case, the final structure (250, 350) has a smaller size than the initial basic structure (210, 310) but has the same tone as the initial basic structure (210, 310).

According to the first embodiment, in the final structure fabrication unit (150), as illustrated in FIG. 2, the final structure (250) may be fabricated by applying the final material to a surface of the temporary structure (220). In this case, the final material may be curable. For example, the final material may be cured after being applied to the surface of the temporary structure (220) and may form the final structure (250). Furthermore, the final structure (250) may be obtained by separating the temporary structure (220) from the final structure (250). In this case, in the final structure fabrication unit (150), as the temporary structure (220) shrinks, the recess (221) of the temporary structure (220) shrinks. In the final structure fabrication unit (150), the final structure (250) may have the pattern (251) corresponding to the recess (221) of the temporary structure (220).

According to the second embodiment, in the final structure fabrication unit (150), as illustrated in FIG. 3, the final structure (350) may be fabricated by applying the final material to the inside of the temporary structure (320). In this case, the final material may be curable. For example, the final material may be cured after being applied to the inside of the temporary structure (320) and may form the final structure (350). Furthermore, the final structure (350) may be obtained by removing the temporary structure (320) from the final structure (350). In this case, the temporary structure (320) may be removed by dissolving the temporary structure (320). For example, the hydrogel may be removed using physical force or through dissolution under a specific chemical condition (e.g., pH, temperature, ion concentration, catalytic treatment, or a chemical reaction). In addition, after using hydrogel that can be expanded or easily deformed under such chemical conditions, the temporary structure (320) may be removed without affecting the shape or size of the final structure (350) by physically removing the hydrogel. In this case, in the temporary structure shrinkage unit (130), as the temporary structure (320) shrinks, the cavity (321) of the temporary structure (320) may also shrink. In the final structure fabrication unit (150), the final structure (350) may have the pattern (351) corresponding to the cavity (321) of the temporary structure (320).

Figure 4:
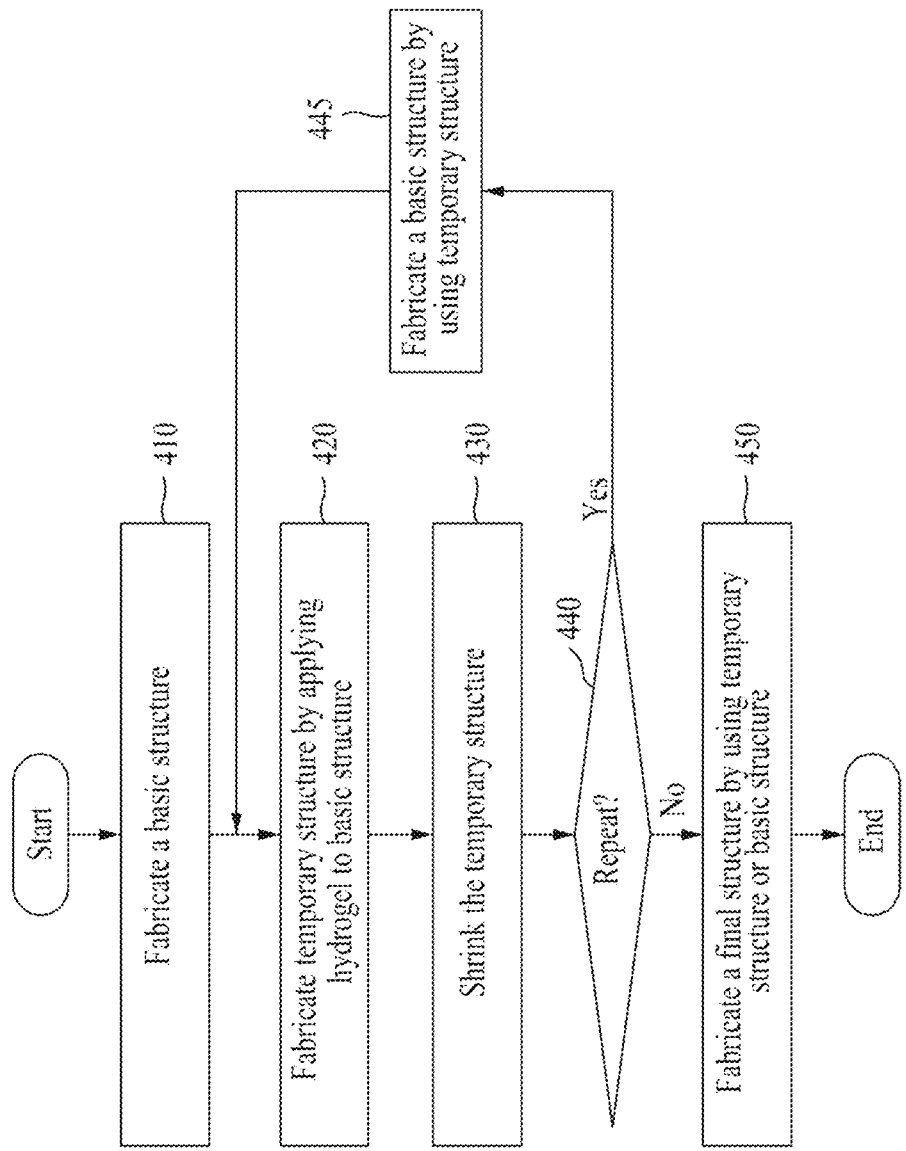
FIG. 4 is a diagram illustrating a method for manufacturing a high-resolution structure according to various embodiments.

FIG. 4 is a diagram illustrating a method for manufacturing a high-resolution structure according to various embodiments.

Referring to FIG. 4, the final structure (250, 350) having high resolution may be manufactured from the basic structure (210, 310) using shrinkable hydrogel. In this case, the basic structure (210, 310) may shrink repeatedly using the hydrogel, and through this, the final structure (250, 350) having higher resolution, that is, a further reduced size, may be manufactured.

First, in step (410), the basic structure (210) may be fabricated. In this case, the basic structure (210, 310) may be fabricated using a curable basic material. Furthermore, the basic structure (210, 310) may be fabricated using a technology capable of producing arbitrary 2-D and 3-D structures, such as patterning, printing, and molding technologies, including 3-D printing.

Next, in step (420), the temporary structure (220, 320) may be fabricated by applying a hydrogel to the basic structure (210, 310). Accordingly, the temporary structure (220, 320) may be made of hydrogel. In this case, the hydrogel may have shrinkable properties. Furthermore, the hydrogel may fill the space in a liquid state having flowability, and then become gelled to form a temporary structure (220, 320) having a shape. The temporary structure (220, 320) may maintain the shape. For example, hydrogel (220, 320) may be a stretchable hydrogel. Accordingly, the temporary structure (220, 320) may have stretchability and flexibility. Furthermore, a channel corresponding to the basic structure (210, 310), that is, the recess (221) or the cavity (321), may be provided.

According to the first embodiment, as illustrated in FIG. 2, the basic structure (210) may have a predetermined pattern (211). For example, the pattern (211) may be provided on one surface of the basic structure (210). In such a case, the temporary structure (220) may be fabricated by applying a hydrogel on the pattern (211) of the basic structure (210). Furthermore, the temporary structure (220) may be obtained by separating the temporary structure (220) from the pattern (211). As the temporary structure (220) has stretchability and flexibility, damage to the temporary structure (220) may be prevented when the temporary structure (220) is separated from the pattern (211). Accordingly, a recess (221) corresponding to the pattern (211) of the basic structure (210) may be provided on one surface of the temporary structure (220) as a channel.

According to the second embodiment, as illustrated in FIG. 3, the basic structure 310 may be obtained according to a predetermined pattern (311). In such a case, the temporary structure (320) may be fabricated by applying a hydrogel to surround the basic structure (310). In this case, the hydrogel may be removed by using physical force or through chemical treatment. For example, hydrogel dissolved under a specific chemical condition (e.g., pH, temperature, ion concentration, catalytic treatment, or a chemical reaction) may be used. Alternatively, the hydrogel can be physically removed after using a hydrogel that can expand or deform easily under these chemical conditions. Furthermore, the temporary structure (320) may be obtained by removing the basic structure (310) from the temporary structure (320). In this case, the basic structure (310) may be removed by using physical force or through chemical treatment. To this end, the basic material of the basic structure (310) may be a material that may be dissolved under a specific condition, such as PLA or ABS. For example, the basic structure (310) may be removed without affecting the shape or size of the temporary structure (320) by dissolving the basic material using an organic solvent such as chloroform or dichloromethane. Alternatively, after being softened through the treatment of the organic solvent, the basic structure (310) may be physically removed. Otherwise, after being dissolved or softened under a specific chemical condition (e.g., pH, temperature, ion concentration, catalytic treatment, or a chemical reaction), the basic structure (310) may be physically removed. Accordingly, the cavity (321) corresponding to the pattern (311) of the basic structure (310) may be obtained as a channel within the temporary structure (320).

Next, in step (430), the temporary structure (220, 320) may shrink. In this case, the temporary structure (220, 320) may shrink by dehydrating the hydrogel. When the hydrogel is dried, moisture in the hydrogel is evaporated, and thus, the temporary structure (220, 320) may shrink. At this time, as the temporary structure (220, 320) shrinks, the channel of the temporary structure (220, 320), that is, the recess (221) or the cavity (321), may also shrink. For example, for isotropic shrinkage, the hydrogel may be slowly dehydrated while gradually raising a temperature in a humid environment. Through this, the temporary structure (220, 320) may shrinks in the longitudinal direction by about 40% to about 50% compared to before the shrinkage Alternatively, hydrogel, which shrinks under a specific chemical condition, may be used. For example, hydrogel, which shrinks at a high temperature or a low temperature, in high pH or low pH, at a high ion concentration or low ion concentration, after a chemical reaction may be used.

Continuously, in step (441), it may be determined whether to execute the repetition. That is, it may be determined whether there is a request for the temporary structure (220, 320) having a further reduced size. In this case, if it is determined that the repetition needs to be performed in step (441), the basic structure (210, 310) may be fabricated again using the temporary structure (220, 320) in step (445). Accordingly, the basic structure (210, 310) having a reduced size may be fabricated. For example, in the first repetition, the basic structure (210, 310) has a size reduced to ½ compared to the initially manufactured basic structure (210, 310) may be fabricated. After that, the temporary structure (220, 320) having a further reduced size may be obtained by repeating steps (420) and (430). That is, the temporary structure (220, 320) of repeatedly reduced size may be fabricated and shrunk. For example, as the number of repetitions increases by two, three, etc., the basic structure (210, 310) having a size reduced by ¼, ⅛, etc., compared to the size of the initial basic structure (210, 310), will be fabricated.

According to the first embodiment, as illustrated in FIG. 2, the basic structure (210) may be fabricated by applying the basic material to a surface of the temporary structure (220). In this case, the basic material may be curable. For example, the basic material may be cured after being applied to the surface of the temporary structure (220) and may form the basic structure (210). Furthermore, the basic structure (210) may be obtained by separating the temporary structure (220) from the basic structure (210). At this time, as the temporary structure (220) shrinks, the recess (221) of the temporary structure (220) also shrinks. The basic structure (210) may have the pattern (211) corresponding to the recess (221) of the temporary structure (220). After that, steps (420) and (430) may be repeated.

According to the second embodiment, as illustrated in FIG. 3, the basic structure (310) may be fabricated by filling the inside of the temporary structure (320) with basic material. In this case, the basic material may be curable. For example, the basic material may be cured after being applied to the inside of the temporary structure (320) and may form the basic structure (310). Furthermore, the basic structure (310) may be obtained by removing the temporary structure (320) from the outside of the basic structure (310). For example, the cured basic material is cut into small pieces to form a powder, put into the cavity (321) inside the temporary structure (320). The temperature is raised to soften or dissolve the basic material to uniformly fill the cavity (321). Then, the temperature can be lowered to harden the basic material. For another example, after the cured basic material is dissolved in a solvent and put into the cavity (321), the cured basic structure (310) may be formed by evaporating the solvent. At this time, the temporary structure (320) may be removed by dissolving the temporary structure (320). For example, the hydrogel may be removed using physical force or through dissolution under a specific chemical condition (e.g., pH, temperature, ion concentration, catalytic treatment, or a chemical reaction). In addition, after using hydrogel that can be expanded or easily deformed under such chemical conditions, the temporary structure (320) may be removed without affecting the shape or size of the basic structure (310) by physically removing the hydrogel. In this case, as the temporary structure (320) shrinks, the cavity (321) of the temporary structure (320) may also shrink. The basic structure (310) may have the pattern (311) corresponding to the cavity (321) of the temporary structure (320). After that, steps (420) and (430) may be repeated.

Finally, in step (450), the final structure (250, 350) may be fabricated using the temporary structure (220, 320) or the basic structure (210, 310). If it is determined that repetition does not need to be performed in step (441), the final structure (250, 350) may be fabricated using the temporary structure (220, 320) or the basic structure (210, 310). In this case, the final material (250, 350) may be fabricated using the final material. For example, the final material may include at least one of elastomer, resin, plastic, metal, metal oxide, ceramic, polymers, or hydrogels. Accordingly, the final structure (250, 350) having a reduced size may be fabricated. For example, if repetition is not performed, the final structure (250, 350) having a size reduced by ½ compared to the size of the initial basic structure (210, 310) may be fabricated. For another example, as two or three repetition numbers are added by the repetition processing unit (140), the final structure (250, 350) having a size reduced by ¼ or ⅛, compared to the size of the initial basic structure (210, 310) may be fabricated. Here, the final structure (250, 350) may be formed from the temporary structure (220, 320). In this case, the final structure (250, 350) has a reverse tone of the initial basic structure (210, 310). The final structure (250, 350) may be formed from the basic structure (210, 310). In such a case, the final structure (250, 350) has a smaller size than the initial basic structure (210, 310) but has the same tone as the initial basic structure (210, 310).

According to the first embodiment, as illustrated in FIG. 2, the final structure (250) may be fabricated by applying the final material to a surface of the temporary structure (220). In this case, the final material may be curable. For example, the final material may be cured after being applied to the surface of the temporary structure (220) and may form the final structure (250). Furthermore, the final structure (250) may be obtained by separating the temporary structure (220) from the final structure (250).

In this case, as the temporary structure (220) shrinks, the recess (221) of the temporary structure (220) shrinks. The final structure (250) may have the pattern (251) corresponding to the recess (221) of the temporary structure (220). In this case, the basic structure (210) and the temporary structure (220) fabricated in the previous processes may be used again because they are not removed.

According to the second embodiment, as illustrated in FIG. 3, the final structure (350) may be fabricated by applying the final material to the inside of the temporary structure (320). In this case, the final material may be curable. For example, the final material may be cured after being applied to the inside of the temporary structure (320) and may form the final structure (350). Furthermore, the final structure (350) may be obtained by removing the temporary structure (320) from the final structure (350). In this case, the temporary structure (320) may be removed by dissolving the temporary structure (320). For example, the hydrogel may be removed using physical force or through dissolution under a specific chemical condition (e.g., pH, temperature, ion concentration, catalytic treatment, or a chemical reaction). In addition, after using hydrogel that can be expanded or easily deformed under such chemical conditions, the temporary structure (320) may be removed without affecting the shape or size of the final structure (350) by physically removing the hydrogel. In this case, as the temporary structure (320) shrinks, the cavity (321) of the temporary structure (320) may also shrink. In the final structure fabrication unit (150), the final structure (350) may have the pattern (351) corresponding to the cavity (321) of the temporary structure (320).

According to various embodiments, a high-resolution structure can be manufactured using size-tunable hydrogel. Specifically, by repeatedly shrinking the hydrogel while replacing the basic structure (210, 310) produced through 3-D printing with the hydrogel, the final structure (250, 350) with a high resolution, that is, a reduced size can be obtained. As such, various embodiments are compatible with the existing 3-D printing technique and can be implemented without additional equipment through a hydrogel that can be synthesized at a low cost, which can be advantageous in cost and time. Furthermore, according to various embodiments, the final structure (250, 350) can be manufactured using several materials, such as an elastomer, resin, plastic, and hydrogel. Accordingly, various embodiments may be utilized to easily manufacture a product suitable for individual needs or to easily manufacture a high-precision and miniaturized device having multiple functions, such as a lab-on-a-chip and a sensor.

A method for manufacturing a high-resolution structure according to various embodiments may include step (410) of fabricating the basic structure (210, 310), step (420) of fabricating the temporary structure (220, 320) made of the hydrogel by applying the hydrogel to the basic structure (210, 310), step (430) of shrinking the temporary structure (220, 320) by shrinking the hydrogel, and step (450) of fabricating the final structure (250, 350) by using the temporary structure (220, 320) or the basic structure (210, 310).

According to the first embodiment, the basic structure (210) may have a predetermined pattern (211). The recess (221) corresponding to the pattern (211) may be provided on one surface of the temporary structure (220).

According to the first embodiment, step (420) of fabricating the temporary structure (220) may include a step of fabricating the temporary structure (220) through the gelation of the hydrogel by applying the hydrogel to the pattern (211), and a step of obtaining the temporary structure (220) by separating the temporary structure (220) from the pattern (211).

According to the first embodiment, the temporary structure (220) may be fabricated to have stretchability and flexibility to prevent damage to the temporary structure (220) when the temporary structure (220) is separated.

According to the first embodiment, after step (420) of shrinking the temporary structure (220), step (410) of fabricating the basic structure (210), step (420) of fabricating the temporary structure (220), and step (430) of shrinking the temporary structure (220) may be repeated.

According to the first embodiment, step (410) of fabricating the basic structure (210), when being repeated, may include a step of fabricating the basic structure (210) by applying basic material to a surface of the temporary structure (220) and step (445) of obtaining the basic structure (210) by separating the temporary structure (220) from the basic structure (210).

According to the first embodiment, step (450) of fabricating the final structure (250) may include a step of fabricating the final structure (250) having the pattern (251) corresponding to the recess (221) by applying the final material to a surface of the temporary structure (220) and a step of obtaining the final structure (250) by separating the temporary structure (220) from the final structure (250).

According to the first embodiment, step (450) of fabricating the final structure (250) may include a step of fabricating the final structure (250) having the same pattern (251) as the recess (221) by applying the final material to a surface of the basic structure (210) and a step of obtaining the final structure (250) by separating the basic structure (210) from the final structure (250).

According to a second embodiment, the basic structure (310) may be obtained according to a predetermined pattern (311). The cavity (321) corresponding to the pattern (311) may be provided within the temporary structure (320).

According to the second embodiment, step (420) of fabricating the temporary structure (320) may include a step of fabricating the temporary structure (320) through the gelation of the hydrogel by applying the hydrogel to surround the basic structure (310) and a step of obtaining the temporary structure (320) by removing the basic structure (310) from the temporary structure (320).

According to the second embodiment, the basic structure (310) is fabricated using a material that may be physically or chemically removable under a predetermined condition and may be removed from the temporary structure (320).

According to the second embodiment, the step of obtaining the temporary structure (320) may include a step of removing the basic structure (310) by dissolving the basic structure (310) by using an organic solvent.

According to the second embodiment, after step (430) of shrinking the temporary structure (320), step (410) of fabricating the basic structure (310), step (420) of fabricating the temporary structure (320), and step (430) of shrinking the temporary structure (320) may be repeated.

According to the second embodiment, step (410) of fabricating the basic structure (310), when being repeated, may include a step of fabricating the basic structure (310) by filling the inside of the temporary structure (320) with basic material and step (445) of obtaining the basic structure (310) by removing the temporary structure (320) from the basic structure (310).

According to the second embodiment, the hydrogel may be removed physically or chemically under a predetermined condition and may be removed from the basic structure (310).

According to the second embodiment, a step of obtaining the basic structure (310) may include a step of removing the temporary structure (320) by dissolving the hydrogel by using a solution having certain pH.

According to the second embodiment, step (450) of fabricating the final structure (350) may include a step of fabricating the final structure (350) having the pattern (351) corresponding to the cavity (321) by applying the final material to the temporary structure (320) and a step of obtaining the final structure (350) by removing the temporary structure (320) from the final structure (350).

According to the second embodiment, step (450) of fabricating the final structure (350) may include a step of fabricating the final structure (350) having the same pattern (351) as the cavity (321) by applying the final material to the basic structure (310) and a step of obtaining the final structure (350) by removing the basic structure (310) from the final structure (350).

According to the second embodiment, step (410) of fabricating the basic structure (310) may include a step of fabricating the basic structure (310) through 3-D printing.

According to various embodiments, the final structure (250, 350) may be made of at least one of elastomer, resin, plastic, metal, metal oxide, ceramic, polymers, or hydrogels.

According to various embodiments, the final structure (250, 350) having high resolution may be manufactured by the method mentioned above.

According to various embodiments, the system (100) for manufacturing a high-resolution structure by performing the method mentioned above may include the basic structure fabrication unit (110) configured to fabricate the basic structure (210, 310), the temporary structure fabrication unit (120) configured to fabricate the temporary structure (220, 320) made of the hydrogel by applying the hydrogel to the basic structure (210, 310), the temporary structure shrinkage unit (130) configured to shrink the temporary structure (220, 320) by shrinking the hydrogel, and the final structure fabrication unit (150) configured to fabricate the final structure (250, 350) by using the temporary structure (220, 320) or the basic structure (210, 310).

According to various embodiments, the system (100) may further include the repetition processing unit (140) configured to fabricate the basic structure (210, 310) from the temporary structure (220, 320) after the temporary structure (220, 320) shrinks and to provide the basic structure (210, 310) to the temporary structure fabrication unit (120).

As described above, the technology, according to various embodiments, is a technology capable of obtaining the final structure having high resolution by repeatedly shrinking the basic structure fabricated through 3-D printing by using a shrinkable hydrogel. FIGS. 5 to 11 are diagrams for describing applications of various embodiments.

Figure 5:
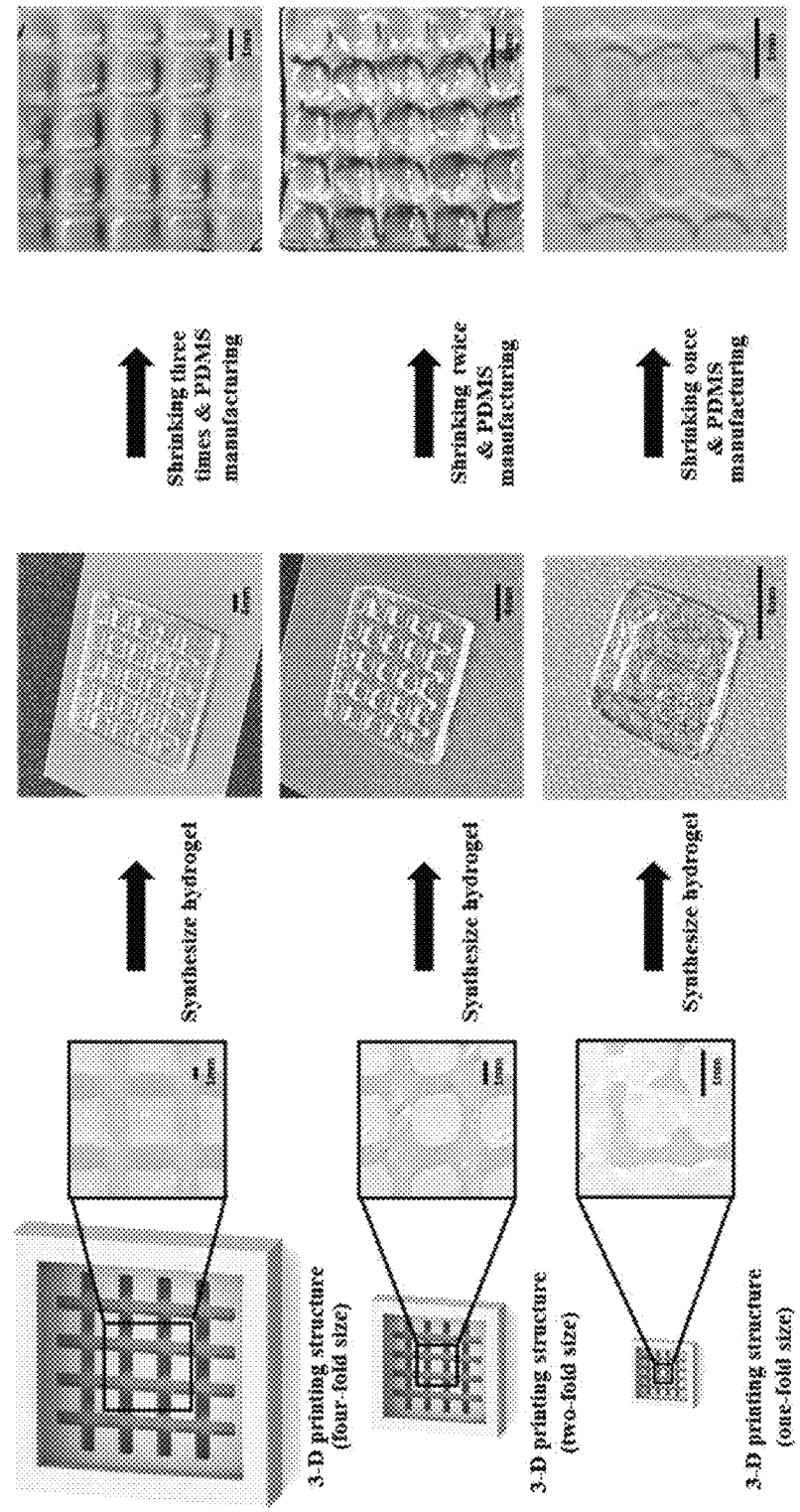

As illustrated in FIG. 5, basic structures having a four-fold size, a two-fold size, and a one-fold size were manufactured using a commonly available FDM-based low-resolution 3-D printer and shrank using the technology according to various embodiments. The basic structure manufactured via 3-D printing, which exceeded the resolution limit, was unclear in shape. On the other side, the final structure obtained through three-times shrinkage had a small size while maintaining the first shape.

Figure 6:
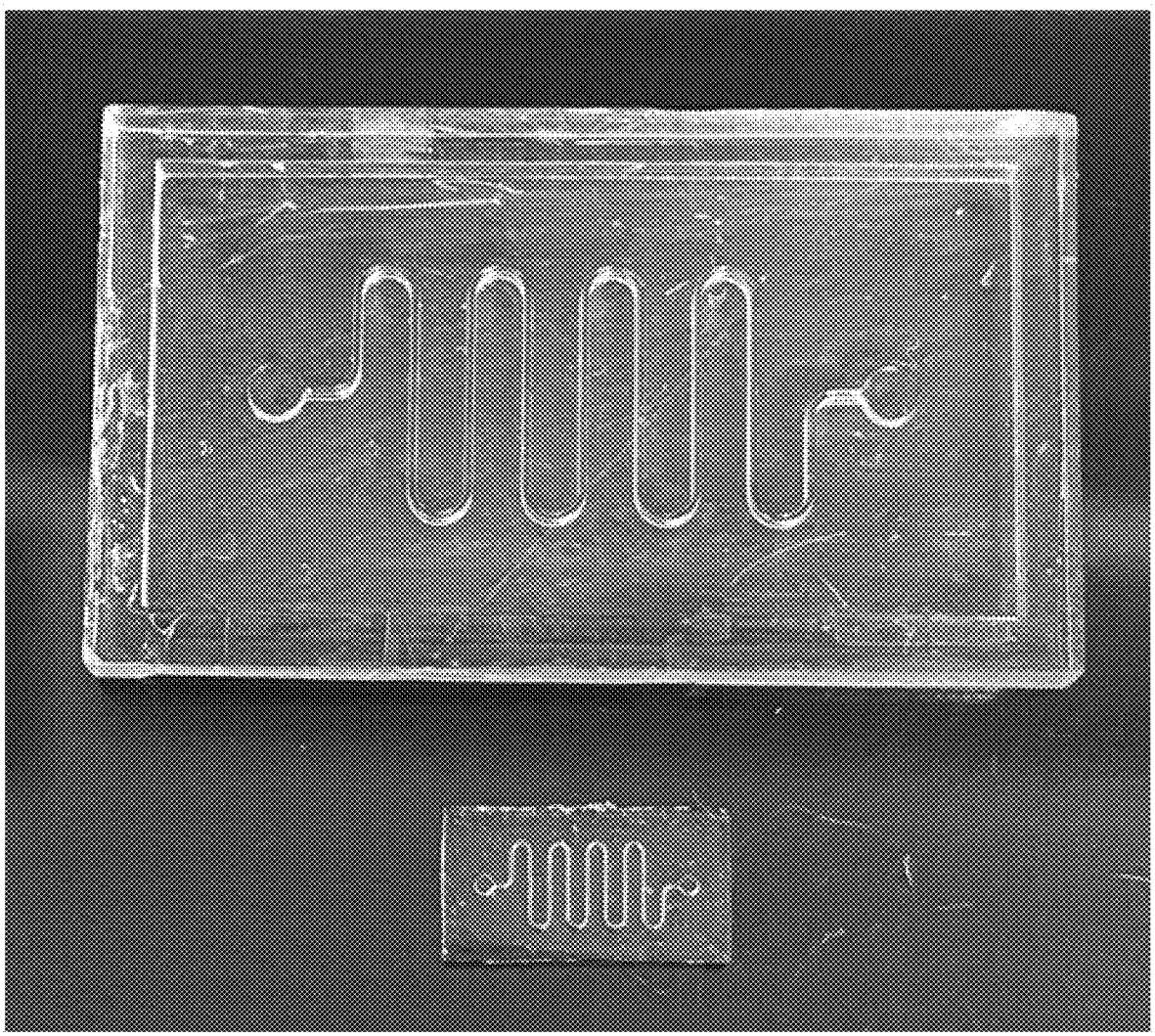

As illustrated in FIG. 6, a mold having a channel thickness of 300 µm was fabricated as a basic structure through 3-D printing. The resolution improvement by about three times (~100 µm) was confirmed by repeatedly applying the technology according to various embodiments.

Figure 7:
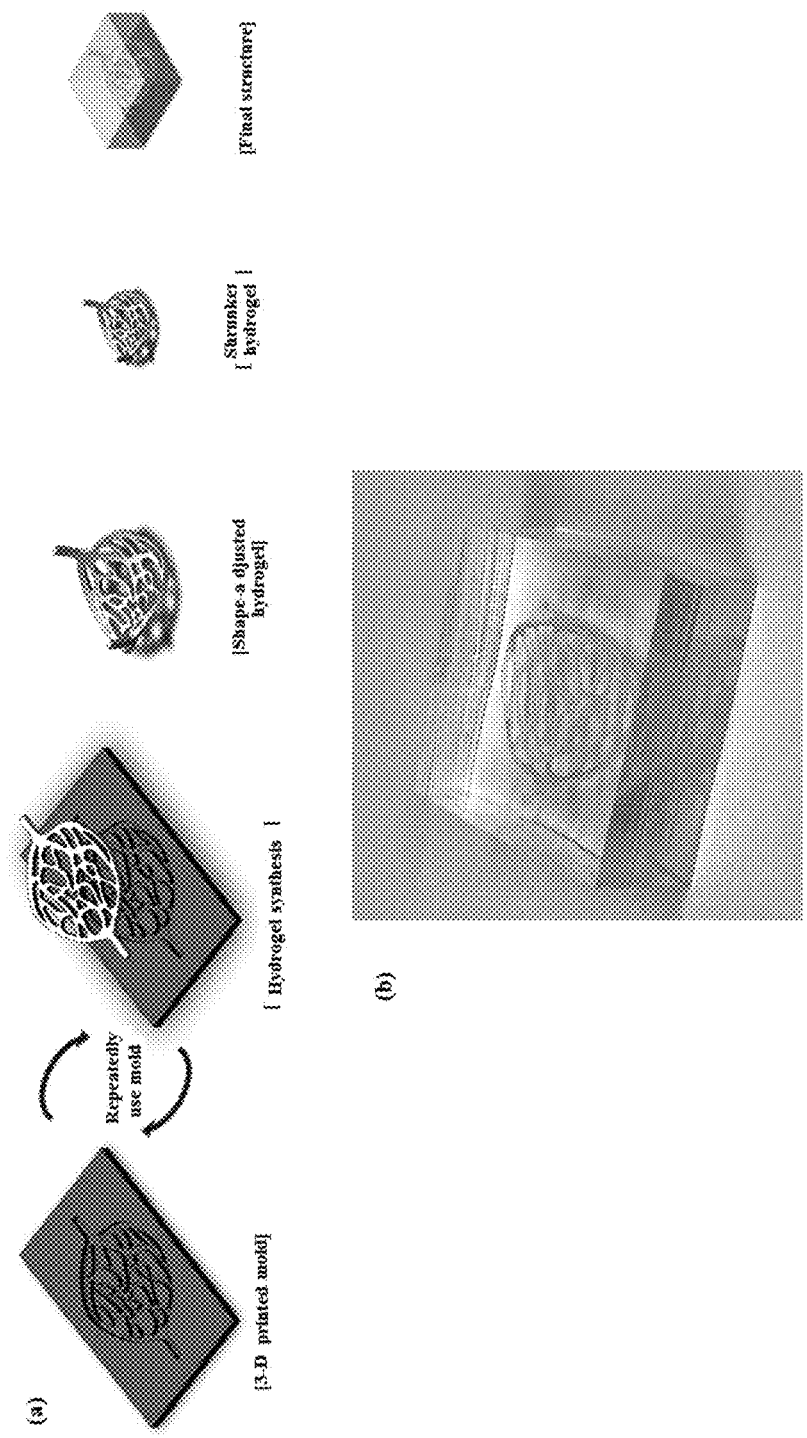

The hydrogel used in the technology, according to various embodiments, has high stretchability and flexibility. As illustrated in FIG. 7, if hydrogel is dehydrated while the shape is controlled during the shrinkage process, the hydrogel shrinks while maintaining the shape. After surrounding the hydrogel with PDMS, it was confirmed that the final structure having a curved channel inside could be manufactured by dissolving the hydrogel inside.

Figure 8:
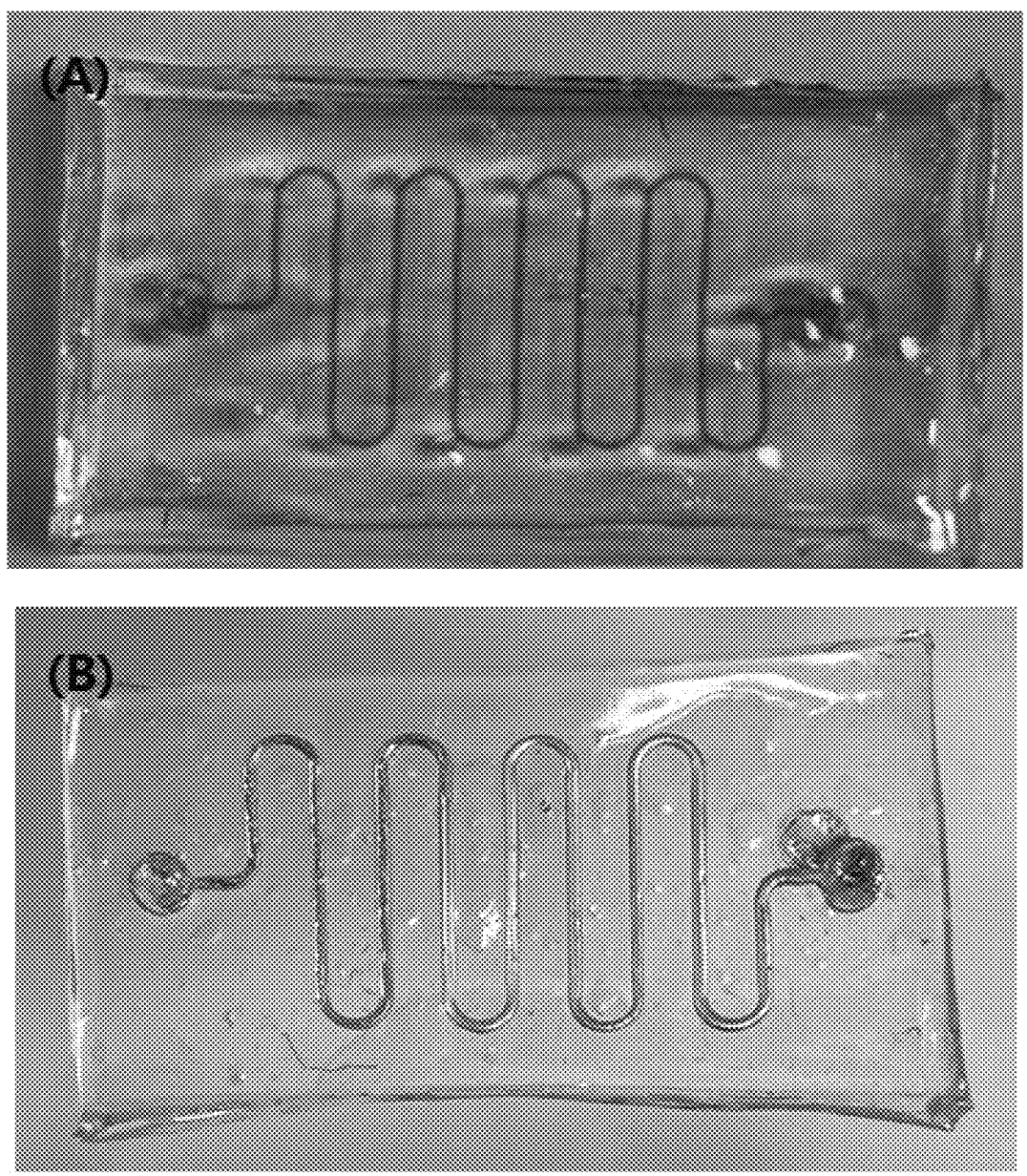

As illustrated in FIG. 8, the final structure made of the hydrogel having a reduced channel was manufactured by applying the technology according to various embodiments. Here, the final structure was manufactured as a reverse tone of the initially fabricated basic structure. As illustrated in FIG. 8(A), by injecting a fluorescent dye inside, it was confirmed that the structure was well maintained even after shrinkage. Furthermore, as illustrated in FIG. 8(B), by injecting liquid metal into the channel, it showed the possibility of application in various fields, such as a sensor.

As illustrated in FIG. 9(A), a hydrogel mask that may be used for material deposition, was manufactured as a temporary structure by applying the technology according to various embodiments. Furthermore, silver nanowire was deposited through spray coating technology. As illustrated in FIG. 9(B), using the flexibility of the hydrogel, silver nanowire was deposited on a curved surface, such as a surface of the glass vial. Then a circuit was constructed to perform an LED light turn-on test.

Figure 10:
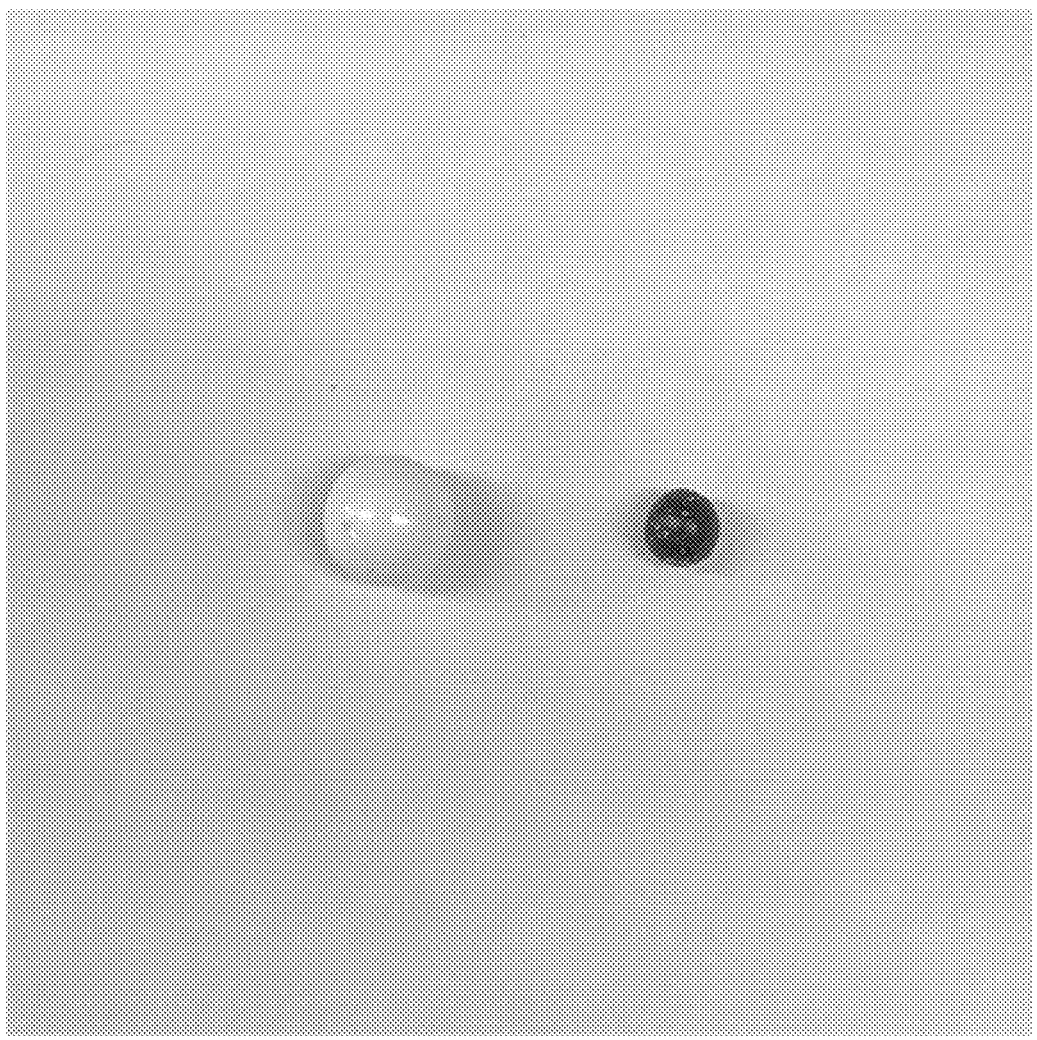
Figure 11:
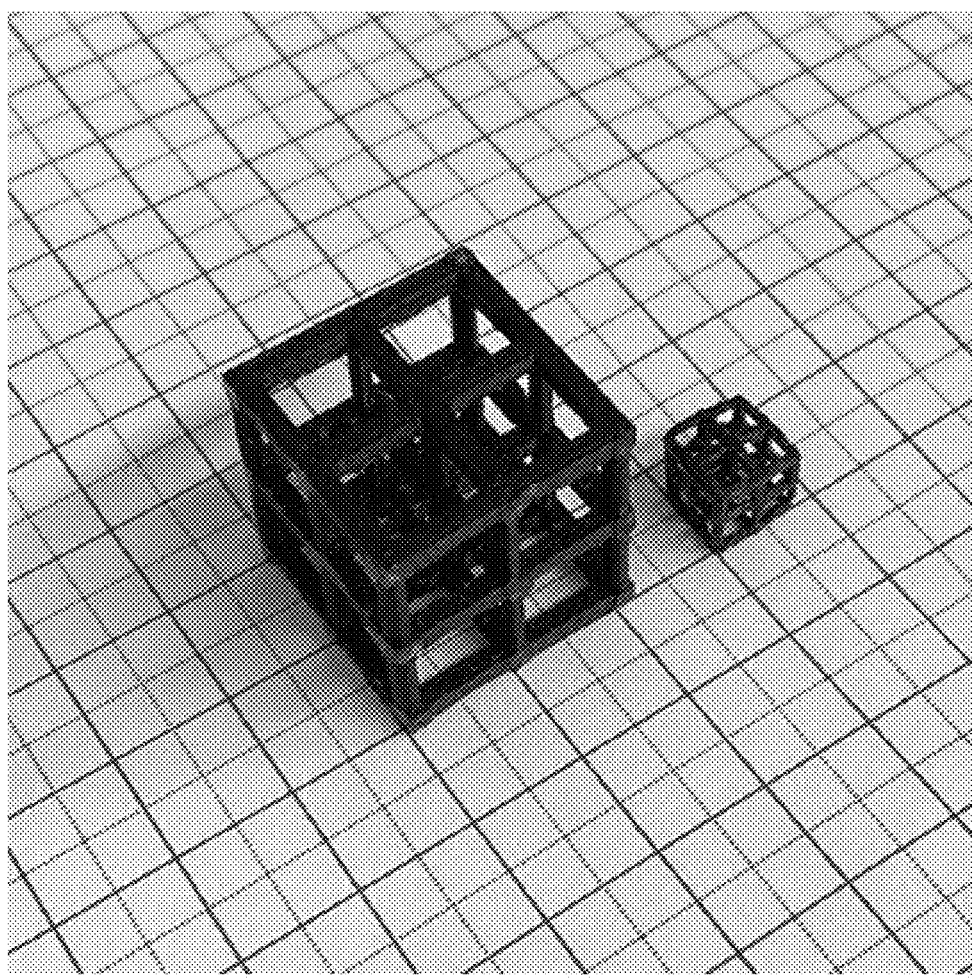

The final structure having a reduced size was manufactured by applying the technology according to various embodiments to a 3-D basic structure. In this case, the final structure was manufactured to have a reduced size with the same structure as the initially fabricated basic structure. To confirm that the technology can also be applied to the 3-D shape structure, as illustrated in FIG. 10, the hydrogel was synthesized to surround the spherical ceramic ball and shrank. After polycaprolactone (PCL) having a relatively low melting point (60° C.) was melted and inserted into the hollow hydrogel, the shrunken 3-D final structure was obtained after hardening. Furthermore, as illustrated in FIG. 11, the technology, according to various embodiments, was also applied to a 3-D basic structure manufactured through 3-D printing.

By fabricating a high-resolution structure by applying the technology according to various embodiments, the technology may be used in several manufacturing industries which require a complex shape and a fine structure.

First, the technology may be applied in the biomedical manufacturing industry. Since the production of personalized medical parts for individual patients is essential in this industry, 3-D printing technology capable of fabricating customized products is highly likely to be utilized. The manufacturing of an implant part through 3-D printing is already being used for dental treatment, and research for printing human organs, such as bone tissue, artificial joints, or blood vessels with complicated and delicate structures, is continuously being conducted.

Second, the technology may be applied to manufacturing a small device (e.g., a lab-on-a-chip or a sensor). Here, the small device refers to a lab-on-a-chip, which is a biomimetic chip that can be used for research in various fields such as medical diagnosis, environmental and chemical analysis, or a sensor that detects, measures, and outputs physical and chemical information. For reasons such as minimization of material loss, ease of design, and high precision, research is being conducted to fabricate devices using 3-D printing. In particular, attempts to improve measurement precision or imitate a complicated structure of a living body by manufacturing a small-sized device with a more complex and delicate structure are in progress.

Various embodiments of this document and the terms used in the embodiments are not intended to limit the technology described in this document to a specific embodiment but should be construed as including various changes, equivalents, and/or alternatives of a corresponding embodiment. Regarding the description of the drawings, similar reference numerals may be used in similar components. An expression of the singular number may include an expression of the plural number unless clearly defined otherwise in the context. In this document, an expression, such as "A or B", "at least one of A and/or B", "A, B or C" or "at least one of A, B and/or C", may include all of the possible combinations of listed items together. Expressions, such as "a first," "a second," "the first," or "the second," may modify corresponding components regardless of their sequence or importance and are used only to distinguish one component from the other component and do not limit corresponding components. When it is described that one (e.g., a first) component is "(functionally or communicatively) connected to" or "coupled with" the other (e.g., a second) component, one component may be directly connected to the other component or may be connected to the other component through another component (e.g., a third component).

The term "unit" used herein includes a unit composed of hardware, software or firmware, and may be used interchangeably with words, such as logic, logical block, part, or circuit. The unit may be a part or an integrated part, a minimum unit to perform one or more functions. For example, the unit may be configured as an Application-Specific Integrated Circuit (ASIC).

According to various embodiments, each (e.g., a module or a program) of the described components may include singular or plural entities. According to various embodiments, at least one component or step may be omitted, or at least one component or step may be added. Alternatively or additionally, a plurality of components (e.g., modules or programs) may be integrated into a single component. In such a case, the integrated component may perform at least one function of each plural component identically or similarly to those performed by the corresponding component before integration. According to various embodiments, steps performed by a module, a program, or another component may be executed sequentially, in parallel, iteratively, or heuristically, or at least one of the steps may be performed in a different order or may be omitted, or at least one step may be added.

The embodiments of the invention in which an exclusive property or privilege is claimed are defined as follows:

1. A method of manufacturing a high-resolution structure, comprising:
    fabricating a first basic structure;
    fabricating a first temporary structure made of a hydrogel by applying a hydrogel to the first basic structure and surrounding all sides of the first basic structure of a basic material with the applied hydrogel;
    shrinking the first temporary structure to create a reduced size second temporary structure by shrinking the hydrogel after removing the first basic structure from the first temporary structure; and
    using the reduced size second temporary structure to fabricate at least one of a final structure and a reduced size second basic structure,
    wherein the first basic structure includes a predetermined three-dimensional pattern, and
    wherein a cavity corresponding to the three-dimensional pattern is provided inside of the first temporary structure,
    wherein the fabricating of the first temporary structure comprises:
    fabricating the first temporary structure through gelation of the hydrogel by applying the hydrogel to surround said all sides of the first basic structure; and
    removing the first basic structure of which said all sides are surrounded by the hydrogel from an inside of the first temporary structure under a first chemical condition to obtain the first temporary structure from which the first basic structure is removed,
    wherein the fabricating of the reduced size second basic structure comprises:
    after the removal of the first basic structure and the shrinking of the first temporary structure, fabricating the reduced size second basic structure by injecting the basic material into an inside space of the second temporary structure of which all sides are surrounded by the hydrogel; and
    removing the second temporary structure surrounding all sides of the reduced size second basic structure outside of the reduced size second basic structure under a second chemical condition different from the first chemical condition to obtain the second temporary structure from which the first temporary structure is removed.

2. The method of claim 1, wherein:
    the first basic structure has the predetermined three-dimensional pattern, and
    a recess corresponding to the predetermined three-dimensional pattern is provided on one surface of the first temporary structure.

3. The method of claim 2, wherein the fabricating of the first temporary structure comprises:
    fabricating the first temporary structure through the gelation of the hydrogel by applying the hydrogel to the predetermined three-dimensional pattern; and
    obtaining the first temporary structure by separating the first temporary structure from the pattern.

4. The method of claim 3, wherein the first temporary structure is fabricated to have stretchability and flexibility, preventing damage to the first temporary structure when the first temporary structure is separated.

5. The method of claim 3, wherein after the shrinking of the first temporary structure, the fabricating of the reduced size second basic structure, the fabricating of the first temporary structure, and the shrinking of the first temporary structure are repeated, and
    wherein the fabricating of the reduced size second basic structure comprises, when being repeated:

fabricating the reduced size second basic structure by applying a basic material to a surface of the reduced size second temporary structure; and obtaining the reduced size second basic structure by separating the reduced size second temporary structure from the reduced size second basic structure.

6. The method of claim 3, wherein the fabricating of the final structure comprises:

fabricating the final structure having a pattern corresponding to the recess by applying a final material to a surface of the reduced size second temporary structure; and obtaining the final structure by separating the reduced size second temporary structure from the final structure.

7. The method of claim 3, wherein the fabricating of the final structure comprises:

fabricating the final structure having a pattern identical with the pattern of the recess by applying a final material to a surface of the reduced size second basic structure; and obtaining the final structure by separating the reduced size second basic structure from the final structure.

8. The method of claim 1, wherein the first temporary structure is obtained by removing the first basic structure by dissolving the first basic structure using an organic solvent.

9. The method of claim 1, wherein after the shrinking of the first temporary structure, the fabricating of the reduced size second basic structure, and fabricating and shrinking of the first temporary structure subsequent to the fabricating of the reduced size second basic structure are repeated.

10. The method of claim 9, wherein the fabricating of the final structure comprises:

after the repetition, fabricating the final structure having a pattern corresponding to the cavity by injecting a final material into an inside space of a finally reduced size second temporary structure of which all sides are surrounded by the hydrogel; and obtaining the final structure by removing the finally reduced size second temporary structure surrounding all sides of the final structure outside of the final structure under the second chemical condition.

11. The method of claim 1, wherein the hydrogel is chemically removable under the second chemical condition and is removed from the reduced size second basic structure.

12. The method of claim 11, wherein removing the second temporary structure comprises removing the second temporary structure by dissolving the hydrogel using a solution with a predetermined pH or chemical composition.

13. The method of claim 1, wherein the fabricating of the first basic structure comprises fabricating the first basic structure through 3-D printing.

* * * * *